(12) United States Patent
Lee

(10) Patent No.: US 8,169,580 B2
(45) Date of Patent: May 1, 2012

(54) VIEWING ANGLE-CONTROLLABLE LIQUID CRYSTAL DISPLAY DEVICE AND FABRICATION METHOD THEREOF

(75) Inventor: Hwi-Deuk Lee, Namyui-ri (KR)

(73) Assignee: LG Display Co., Ltd., Seoul (KR)

( * ) Notice: Subject to any disclaimer, the term of this patent is extended or adjusted under 35 U.S.C. 154(b) by 351 days.

(21) Appl. No.: 12/615,617

(22) Filed: Nov. 10, 2009

(65) Prior Publication Data

US 2010/0149449 A1 Jun. 17, 2010

(30) Foreign Application Priority Data

Dec. 16, 2008 (KR) ........................ 10-2008-0128107

(51) Int. Cl.
*G02F 1/1368* (2006.01)
*G02F 1/1333* (2006.01)
*H01L 21/77* (2006.01)

(52) U.S. Cl. .......... 349/141; 349/42; 349/106; 349/143; 349/187; 438/30

(58) Field of Classification Search ................. 349/42, 349/43, 106, 107, 108, 141, 177, 187; 438/30, 438/151; 257/59, 72; 345/88, 92
See application file for complete search history.

(56) References Cited

U.S. PATENT DOCUMENTS

| 2008/0143930 A1* | 6/2008 | Jin et al. ................. 349/96 |
| 2008/0165297 A1* | 7/2008 | Matsushima ............. 349/33 |
| 2009/0059144 A1* | 3/2009 | Lin et al. ................. 349/119 |
| 2009/0225106 A1* | 9/2009 | Kim et al. ................ 345/691 |
| 2010/0128208 A1* | 5/2010 | Kurasawa ................ 349/106 |

* cited by examiner

*Primary Examiner* — David Nelms
*Assistant Examiner* — Tai Duong
(74) *Attorney, Agent, or Firm* — Brinks Hofer Gilson & Lione

(57) ABSTRACT

A viewing angle controllable liquid crystal display device including red, green and blue color pixels and a control pixel of an electrically controlled birefringence (ECB) mode and its fabrication method are disclosed. A gate insulating layer and a passivation layer at a pixel area of the ECB control pixel are removed by using a half-tone mask to additionally secure a cell gap to thus maximize efficiency of the ECB control pixel to improve a viewing angle control effect. In addition, a light leakage is prevented by reducing a step in the vicinity of the pixel area of the ECB control pixel.

10 Claims, 11 Drawing Sheets

VIEWING ANGLE-CONTROLLABLE LIQUID CRYSTAL DISPLAY DEVICE AND FABRICATION METHOD THEREOF

This application claims the benefit of Korea Patent Application No. 10-2008-0128107, filed on Dec. 16, 2008, the entire contents of which is incorporated herein by reference for all purposes as if fully set forth herein.

BACKGROUND

1. Field of the Invention

The present disclosure relates to a liquid crystal display (LCD) device whose viewing angle can be controlled and its fabrication method, and more particularly, to a viewing angle-controllable LCD device capable of selectively implement a wide viewing angle and a narrow viewing angle and its fabrication method.

2. Discussion of the Related Art

As the consumer's interest in information displays grows and the demand for portable (mobile) information devices increases, research and commercialization of light and thin flat panel displays ("FPD"), which substitute cathode ray tubes (CRTs), the conventional display devices, has increased. Among FPDs, the liquid crystal display ("LCD") is a device for displaying images by using optical anisotropy of liquid crystal. LCD devices exhibit excellent resolution, color display and picture quality, so they are commonly used for notebook computers or desktop monitors, and the like.

The LCD includes a color filter substrate, an array substrate and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

The structure of a general LCD will now be described in detail with reference to FIG. 1. FIG. 1 is an exploded perspective view showing a general LCD device. As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel areas (P), TFTs (T), switching elements, formed at respective crossings of the gate lines 16 and the data lines 17, and pixel electrodes 18 formed on the pixel areas (P).

The color filter substrate 5 and the array substrate 10 are attached in a facing manner by a sealant (not shown) formed at an edge of an image display region to form a liquid crystal panel, and the attachment of the color filter substrates 5 and the array substrate 10 is made by an attachment key formed on the color filter substrate 5 or the array substrate 10.

In the situation that interest in a personal information protection is increasing, a peeping preventing technique such as attaching a peep preventing seal on a screen is being developed for a case where a user wants to view a screen image exclusively by himself through a notebook computer, mobile phone, and the like, but this technique has a problem in that the screen darkens, a field of vision is limited, and the like.

BRIEF SUMMARY

A liquid crystal display (LCD) device includes: first and second substrates including four subpixels of RGB color pixels and an ECB control pixel; a gate electrode and a gate line formed on the first substrate; a gate insulating layer formed on the first substrate with the gate electrode and the gate line formed thereon; an active pattern formed on the gate insulating layer; source and drain electrodes formed on the active pattern and connected with source and drain regions of the active pattern and a data line formed on the active pattern and crossing the gate line to define a pixel area; a passivation layer formed on the first substrate with the active pattern, the source and drain electrodes, and the data line formed thereon, and having a first contact hole formed by removing a portion of the passivation layer and exposing a portion of the drain electrode; a pixel electrode formed within the pixel area of the RGB color pixels and connected with the drain electrode via the first contact hole and a common electrode formed within the pixel area of the RGB color pixels and alternately disposed with the pixel electrode to generate an in-plane field; and a pixel electrode formed within the pixel area of the ECB color pixels and connected with the drain electrode via the first contact hole, wherein the pixel electrode of the ECB control pixel is formed within a hole of the pixel area of the ECB control pixel formed to be open as the gate insulating layer and the passivation layer of the ECB control pixel is removed, and a portion of the thickness of the gate insulating layer remains in the vicinity of the pixel area of the ECB control pixel.

A method for fabricating a liquid crystal display (LCD) device, includes: providing first and second substrates including four subpixels of RGB color pixels and ECB control pixel; forming a gate electrode and a gate line on the first substrate; forming a gate insulating layer on the first substrate with the gate electrode and the gate line formed thereon; forming an active pattern on the gate insulating layer; forming source and drain electrodes connected with source and drain regions of the active pattern on the active pattern and forming a data line crossing the gate line to define a pixel area; forming a passivation layer on the first substrate with the active pattern, the source and drain electrodes, and the data line formed thereon; removing a portion of the passivation layer through a half-tone mask to form a first contact hole exposing a portion of the drain electrode, and removing the gate insulating layer and the passivation layer of the ECB control pixel to form a hole opening the pixel area of the ECB control pixel; selectively removing the gate insulating layer and the passivation layer of the ECB control pixel through the half-tone mask to leave a portion of the thickness of the gate insulating layer in the vicinity of the pixel area of the ECB control pixel; forming a pixel electrode within the pixel area of the RGB color pixels such that the pixel electrode is connected with the drain electrode via the first contact hole, and forming a common electrode alternately disposed with the pixel electrode to generate an in-plane field; forming a pixel electrode within a hole of the pixel area of the ECB control pixel such that the pixel electrode is connected with the drain electrode via the first contact hole; and attaching the first and second substrate.

It is to be understood that both the foregoing general description and the following detailed description are exemplary and explanatory and are intended to provide further explanation of embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE DRAWINGS AND THE PRESENTLY PREFERRED EMBODIMENTS

Exemplary embodiments of a liquid crystal display (LCD) device and its fabrication method according to exemplary embodiments of the present invention will now be described with reference to the accompanying drawings.

Figure 1:
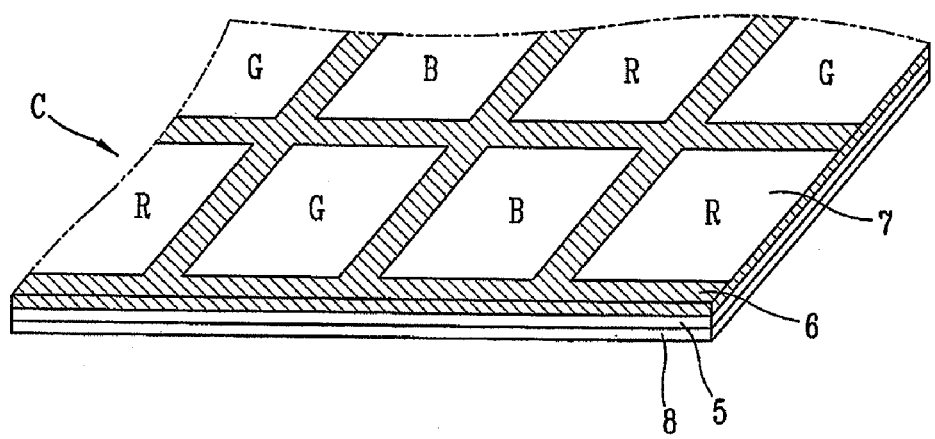
FIG. 1 is an exploded perspective view schematically showing a general liquid crystal display (LCD) device.
Figure 1:
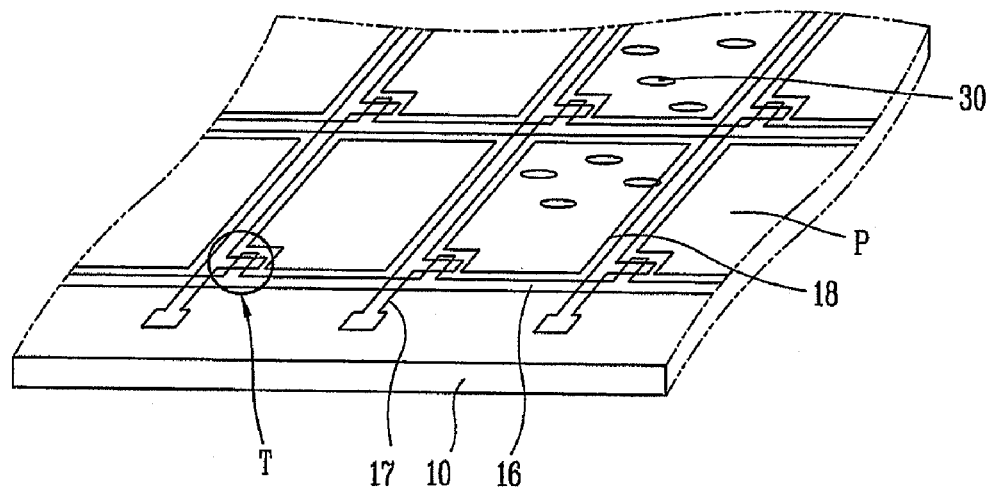
Figure 2:
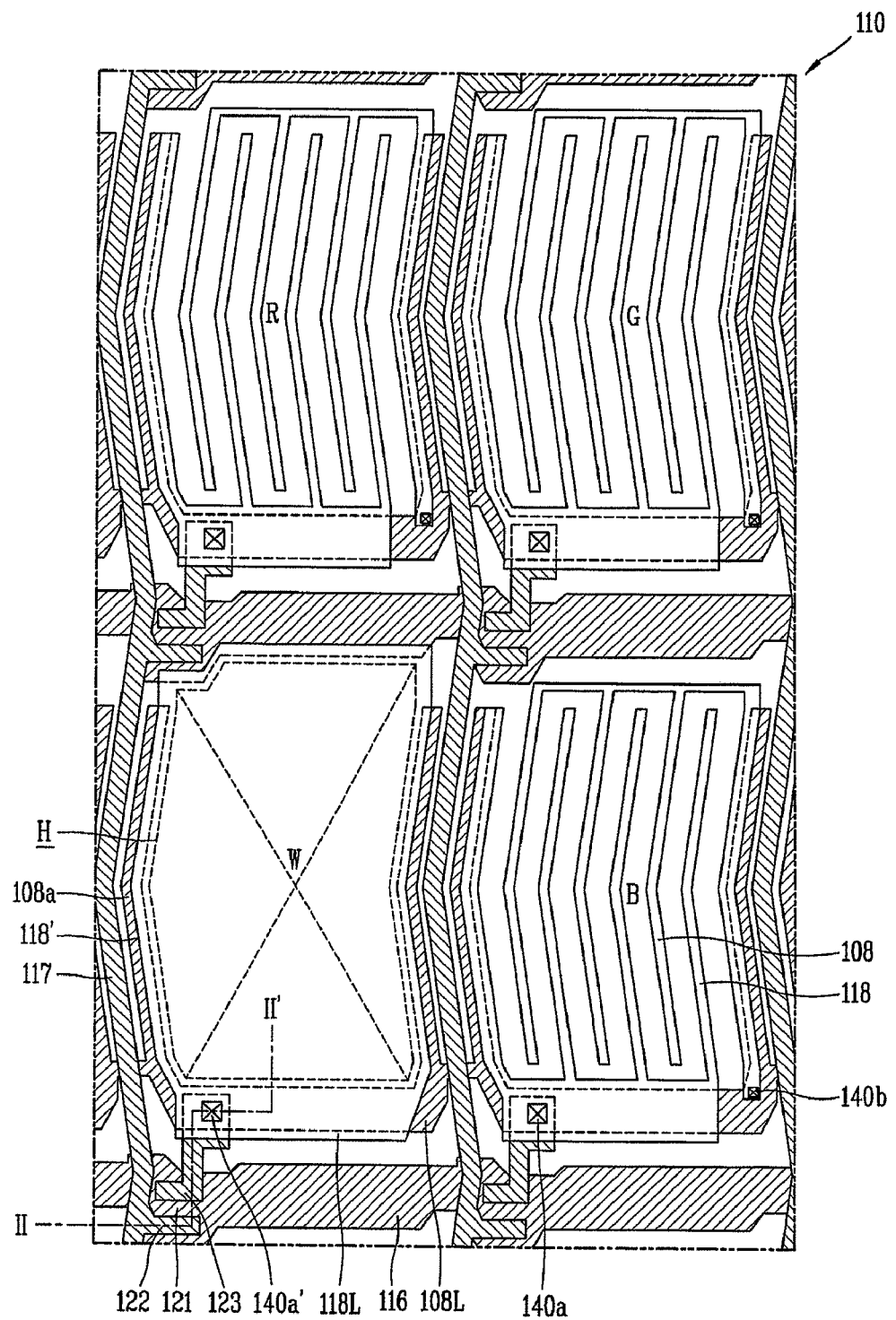
FIG. 2 is a plan view schematically showing a portion of an array substrate of an LCD device according to an exemplary embodiment of the present invention.

FIG. 2 is a plan view schematically showing a portion of an array substrate of an LCD device according to an exemplary embodiment of the present invention. Specially, FIG. 2 shows an LCD device with a quad type structure including red (R), green (G), and blue (B) color pixels and a controlled birefringence (ECB) mode control pixel as a single unit pixel.

In this case, when common electrodes and pixel electrodes have a bent structure, because liquid crystal molecules are arranged in two directions to form two domains, the viewing angle can be further improved compared with a mono-domain. The present invention is not limited to the two-domain structured IPS mode LCD and can be applicable to an IPS mode LCD having multi-domain structure more than the two-domain.

For reference, the RGB color pixels include the same elements except for a sub-color filter of a color filter substrate. Also, as for the four sub-pixels (R, G, B, and W) of the RGB color pixels and the ECB control pixel in the array substrate, they include substantially the same elements, except for the pixel electrode structure of the sub-pixel (W) of the ECB control pixel. Thus, the same reference numerals are used for the same elements, and the sub-pixel (W) of the ECB control pixel will be described as a base.

Figure 3:
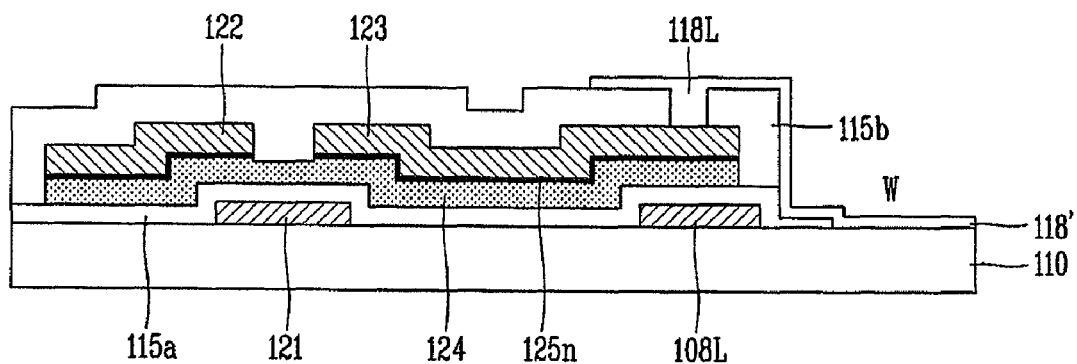
FIG. 3 is a sectional view taken along line II-II' of the array substrate illustrated in FIG. 2.

For reference, FIG. 3 is a schematic sectional view taken along line II-II' of the array substrate of FIG. 2, showing the section of the array substrate with respect to the sub-pixel (W) of the ECB control pixel.

As illustrated, in the exemplary embodiment of the present invention, gate lines 116 and data lines 117 are formed to be arranged vertically and horizontally to define a pixel region on an array substrate 110, and a thin film transistor (T), a switching element, is formed at a crossing of the gate line 116 and the data line 117.

The TFT includes a gate electrode 121 forming a portion of the gate line 116, a source electrode 122 connected with the data line 117 and a drain electrode 123 connected to pixel electrodes 118 and 118' via a pixel electrode line 118L. The TFT further includes a gate insulating layer 115a for insulating the gate electrode 121 and the source and drain electrodes 122 and 123, and an active pattern 124 forming a conductive channel between the source and drain electrodes 122 and 123 by a gate voltage supplied to the gate electrode 121. In this case, although the source electrode 122 has an 'L' shape, making the channel of the TFT formed in the 'L' shape, but the present invention is not limited thereto and any types of channels of the TFT can be applicable.

In the sub-pixel (W) of the ECB control pixel, a pixel electrode 118' is formed to drive liquid crystal together with an ITO electrode of the upper color filter substrate (not shown), and ECB driving is performed by a vertical field by the upper ITO electrode and the lower pixel electrode 118'.

A portion of the source electrode 122 extends in one direction to form a portion of the data line 117, and a portion of the drain electrode 123 extends toward the pixel area so as to be connected to the pixel electrode line 118L via first contact holes 140a and 140a' formed at a passivation layer 115b.

As mentioned above, in the pixel area of the RGB color pixels, the plurality of common electrodes and pixel electrodes 118 for generating in-plane field are alternately disposed, and in this case, the common electrodes 108 and the pixel electrodes 118 are arranged to be substantially parallel to the data line 117.

A common line 108L is disposed to be substantially parallel to the gate line 116 at a lower portion of the pixel electrode line 118L, and the common line 108L overlaps with a portion of the pixel electrode line 118L with the gate insulating layer 115a and the passivation layer 115b interposed therebetween to form a storage capacitor. The storage capacitor serves to uniformly maintain the voltage which has been applied to the liquid crystal capacitor until when a next signal comes in. Besides maintaining the signal, the storage capacitor has the effects of stabilizing a gray scale representation, reducing flickering, reducing the formation of residual images, and the like.

The common line 108L is connected with a connection line 108a disposed to be substantially parallel to the data line 117, and the connection line 108 of the RGB color pixels is connected with the common electrode 108 via the second contact hole 140b formed at the gate insulating layer 115a and the passivation layer 115b.

As to the LCD device according to the exemplary embodiment of the present configured as described above, in case of the RGB color pixels, IPS driving is performed by in-plane field, and in case of the ECB control pixel, dual-mode driving, namely, ECB driving, is performed by a vertical field.

In the sub-pixel (W) of the ECB control pixel according to an exemplary embodiment of the present invention, the pixel electrode 118' of the ECB control pixel is formed within a hole (H) open as the gate insulating layer 115a and the passivation layer 115b are removed, whereby a cell gap of about 5000 Å can be additionally secured compared with the sub-pixels R, G, and B of the R, G, and B color pixels.

Namely, in order to improve the efficiency of the ECB control pixel, the opening area of the pixel electrode of the ECB control pixel or the cell gap needs to be increased, and in this case, the increase in the opening area would cause a side effect such as a light leakage of the sub-pixel of the ECB control pixel and a reduction in the aperture ratio of the sub-pixel of the RGB color pixels.

In addition, in order to increase the cell gap, the material of a overcoat layer with a high viscosity may be used or the overcoat layer of the ECB control pixel may be patterned, but in case of the overcoat layer with a high viscosity, a step between sub-pixels would increase to increase disclination at the boundary, and in addition, a additional process should be necessarily performed to pattern the overcoat layer.

Thus, based on the fact that the efficiency of the sub-pixel of the ECB control pixel controlling a viewing angle is proportional to the increase in the cell gap, in an exemplary embodiment of the present invention, the gate insulating layer 115a and the passivation layer 115b of the pixel area of the ECB control pixel are removed to secure an additional cell gap. As a result, the efficiency of the ECB control pixel can be increased by about 19%, improving the viewing angle control effect through effect maximization.

In an exemplary embodiment, when the first contact holes 140a and 140a' and the second contact hole 140b are formed at the gate insulating layer 115a and the passivation layer 115b, the gate insulating layer 115a and the passivation layer 115b of the pixel area of the ECB control pixel are removed by using a half-tone mask or a diffraction mask (or a slit mask) (mentioning of the half-tone mask will also include the slit mask, hereinafter), thus removing the necessity of an additional masking process.

Also, patterning is performed to leave a portion of the thickness of the gate insulating layer 115a in the vicinity (E) of the pixel area of the ECB control pixel, thereby reducing a step in the vicinity (E) of the pixel area of the ECB control pixel according to the increase in the cell gap. As a result, a light leakage in the vicinity (E) of the pixel area of the ECB control pixel can be prevented. This will now be described in detail through a method of fabricating an LCD device according to an exemplary embodiment of the present invention.

FIGS. 4A to 4D are plan views sequentially showing the process of fabricating the array substrate of FIG. 2.

FIGS. 5A to 5D are sectional view taken along line Ii-II' of the array substrate of FIG. 2, sequentially showing the fabrication process.

Figure 4A:
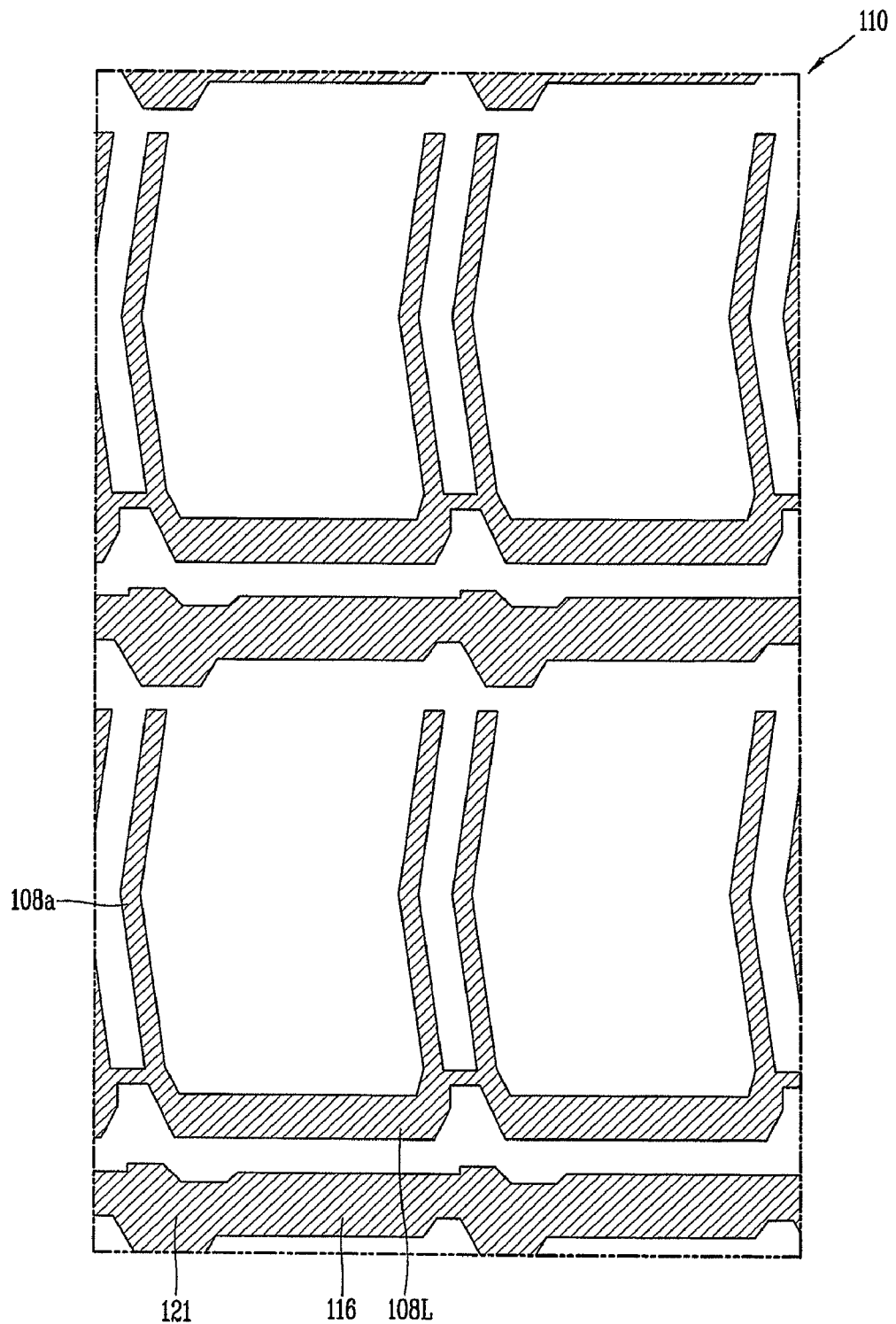
FIGS. 4A to 4D are plan views sequentially showing the process of fabricating the array substrate of FIG. 2.
Figure 5A:
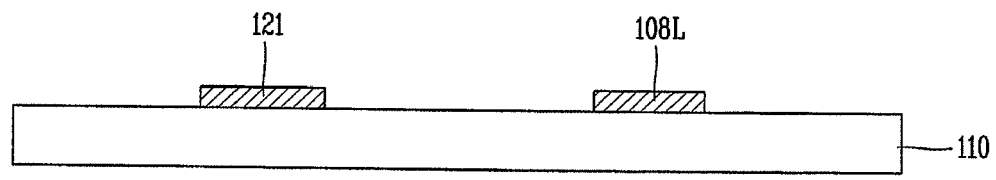
FIGS. 5A to 5D are sectional view taken along line II-II' of the array substrate of FIG. 2, sequentially showing the fabrication process.

As shown in FIGS. 4A and 5A, the gate line 116 including the gate electrode 121, the common line 108L and the connection line 108a are formed on the array substrate 110 made of a transparent insulation material such as glass.

In this case, the gate electrode 121, the gate line 116, the common line 108L and the connection line 108a are formed by depositing a first conductive film on the entire surface of the array substrate 110 and then selectively patterning the first conductive film through a photolithography process (a first masking process).

Here, the first conductive film may be made of a low-resistance opaque conductive material such as aluminum (Al), an aluminum alloy, tungsten (W), copper (Cu), chromium (Cr), molybdenum (Mo), a molybdenum alloy, or the like. Also, the first conductive film may be formed with a multi-layered structure by stacking two or more low-resistance conductive materials.

In this case, the common line 108L is formed to be substantially parallel to the gate line 116, and the connection line 108a may be formed to have the same bent structure as that of the common electrode and the pixel electrode of the RGB color pixels to be formed in a follow-up process.

Figure 4B:
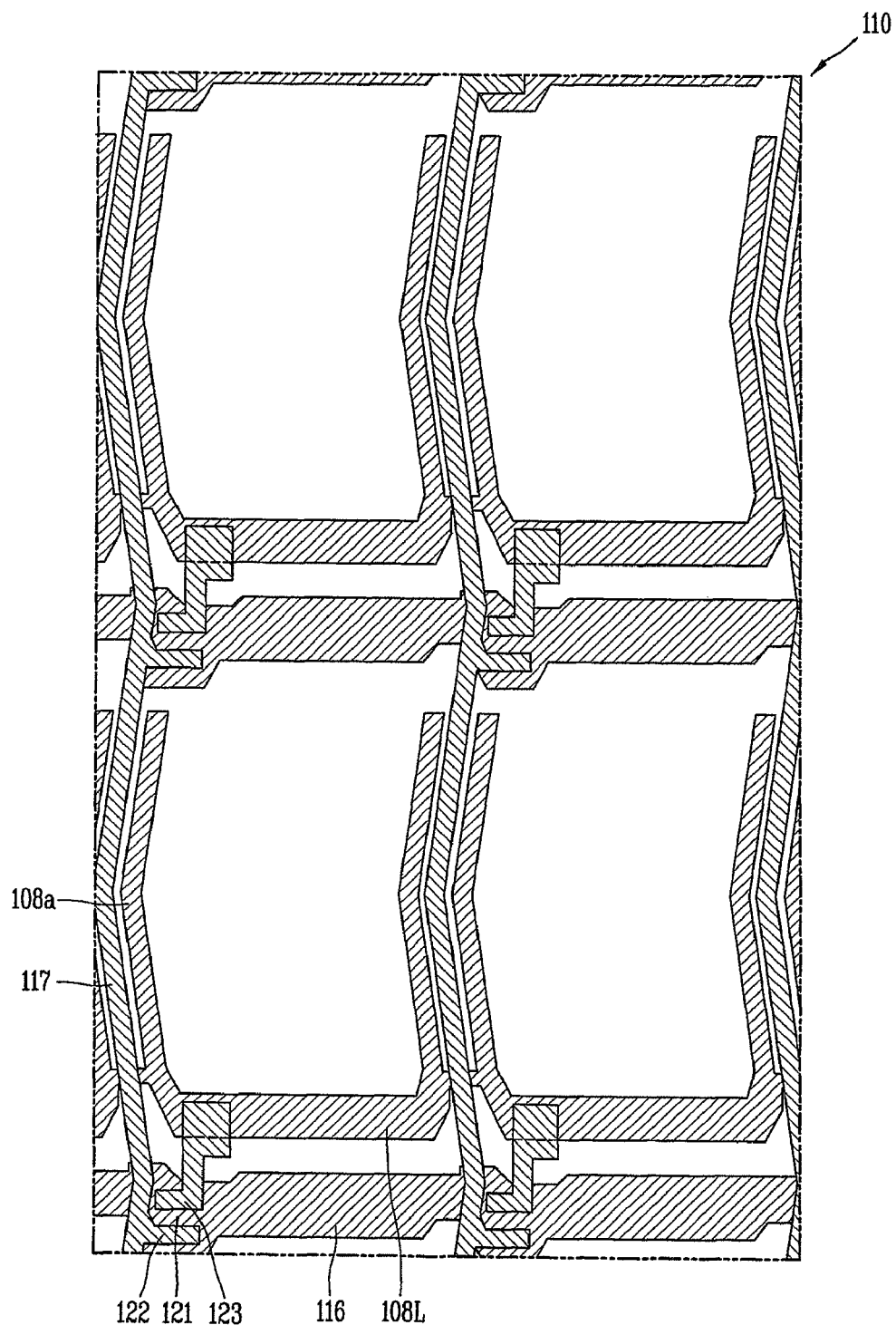
Figure 5B:
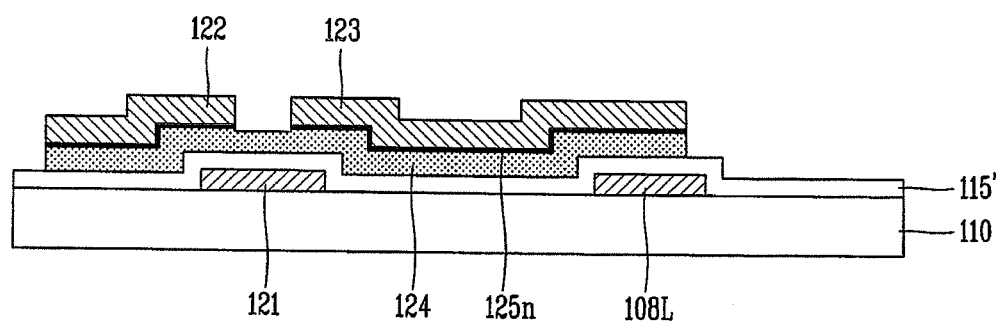

Next, as shown in FIGS. 4B and 5B, a first insulating layer 115', an amorphous silicon thin film, an n+ amorphous silicon thin film, and a second conductive film are formed on the entire surface of the array substrate 110 for covering the gate electrode 121, the gate line 116, the common line 108L and the connection line 108a, and then selectively removed through a photolithography process (a second masking process) to form the active pattern 124 formed of the amorphous silicon thin film at the pixel part of the array substrate 110, and the source and drain electrodes 122 and 123 formed of the second conductive film and connected with the source and drain regions of the active pattern 124.

Also, through the second masking process, the data line formed of the second conductive film and crossing the gate line 116 to define the pixel area is formed. In this case, the data line 117 is formed to be substantially parallel to the connection line 108a.

The second conductive film may be made of a low-resistance opaque conductive material such as aluminum (Al), an aluminum alloy, tungsten (W), copper (Cu), chromium (Cr), molybdenum (Mo), a molybdenum alloy, or the like, to form the source electrode 122, the drain electrode 123, and the data line 117. Also, the second conductive film may be formed with a multi-layered structure by stacking two or more low-resistance conductive materials.

At this time, an ohmic-contact layer 125n formed of the n+ amorphous silicon thin film, which has been patterned in the same shape as the source and drain electrodes 122 and 123, is formed on the active pattern 124.

Here, in the exemplary embodiment of the present invention, the active pattern 124, the source and drain electrodes 122 and 123, and the data line 117, can be simultaneously formed through a single masking process (the second masking process) by using the half-tone mask.

Figure 4C:
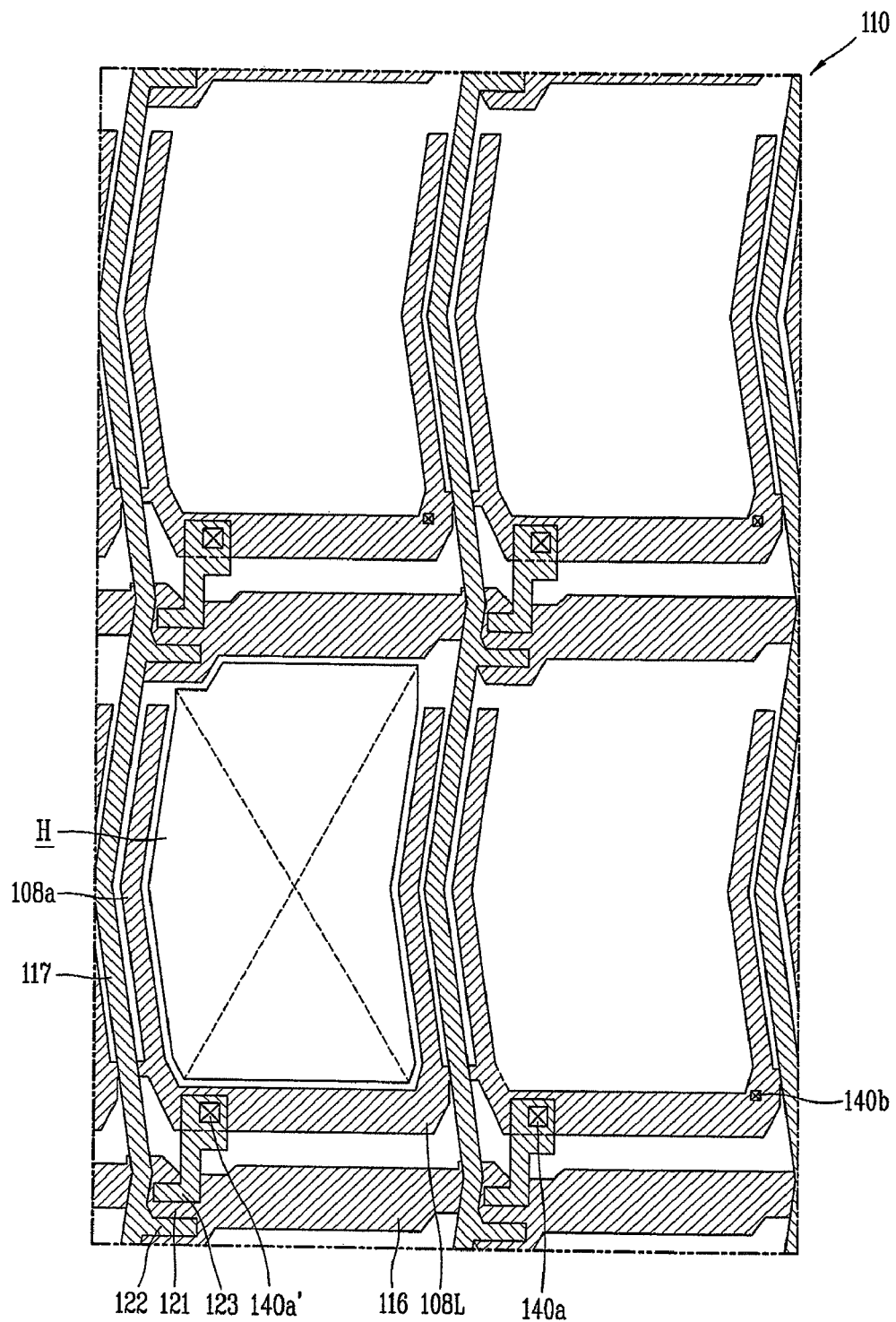
Figure 5C:
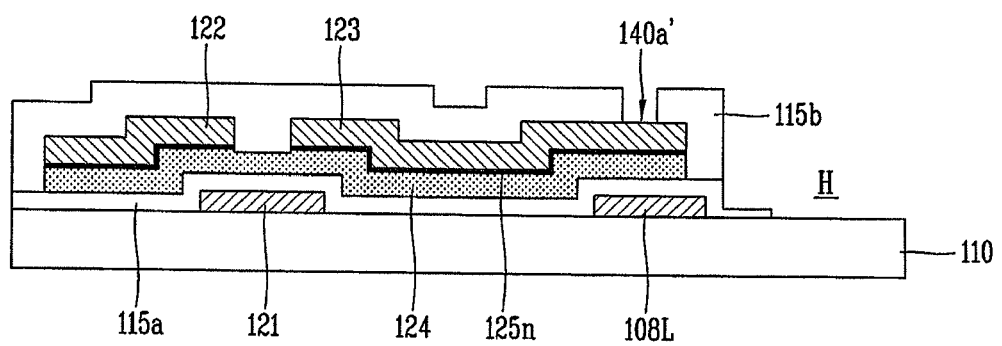

Thereafter as shown in FIGS. 4C and 5C, a second insulating layer is formed on the entire surface of the array substrate 110 for covering the active pattern 124, the source and drain electrodes, and selectively removed through a photolithography process (a third masking process) to form the first contact holes 140a and 140a' exposing a portion of the drain electrode 123 at the pixel part of the array substrate 110, and also form the second contact hole 140b exposing a portion of the common line 108L of the RGB color pixels.

At this time, as the first insulating layer and the second insulating layer at the pixel area of the ECB control pixel are removed through the third masking process, the hole (H) opening the pixel area of the ECB control pixel is formed.

Patterning is performed to leave a portion of the thickness of the gate insulating layer 115a in the vicinity of the pixel area of the ECB control pixel according to an exemplary embodiment of the present invention, thereby reducing a step in the vicinity of the pixel area of the ECB control pixel according to the increase in the cell gap. As a result, a light leakage in the vicinity of the pixel area of the ECB control pixel can be prevented.

Here, through the single third masking process using the half-tone mask, the first contact holes 140a and 140a', the second contact hole 140b, and the hole (H) are formed and, at the same time, patterning is performed to leave the portion of the thickness of the gate insulating layer 115a in the vicinity of the pixel area of the ECB control pixel. The third masking process will now be described in detail.

FIGS. 6A to 6F are sectional views showing a third masking process illustrated in FIGS. 4C and 5C according to an exemplary embodiment of the present invention.

Figure 6A:
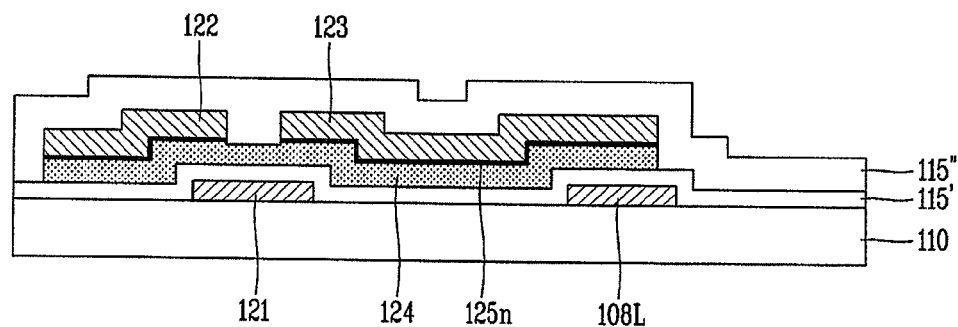
FIGS. 6A to 6F are sectional views showing a third masking process illustrated in FIGS. 4C and 5C according to an exemplary embodiment of the present invention.

As shown in FIG. 6A, a second insulating layer 115" is formed on the entire surface of the array substrate 110 for covering the active pattern 124, the source electrode 122, and the drain electrode 123.

Here, the second insulating layer 115" may be made of an inorganic insulation film such as a silicon nitride film or a silicon oxide film, or may be made of an organic insulation film such as photoacryl or benzocyclobutene (BCB).

Figure 6B:
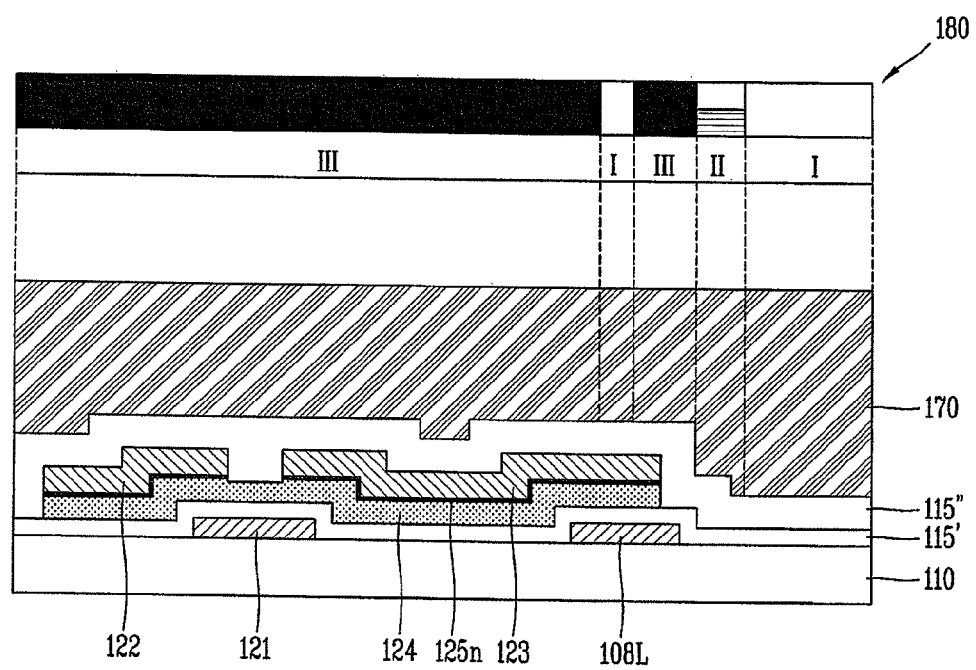

Next, as shown in FIG. 6B, a photosensitive film 170 made of a photosensitive material such as photoresist is formed on the entire surface of the array substrate 110, to which light is selectively irradiated via the half-tone mask 180 according to an exemplary embodiment of the present invention.

The half-tone mask 180 includes a first transmission region (I) that allows irradiated light to be entirely transmitted therethrough, a second transmission region (II) that allows only some light to be transmitted therethrough while blocking the remaining light, and a blocking region (III) that entirely blocks the irradiated light. Only light which has transmitted through the half-tone mask 180 can be irradiated on the photosensitive film 170.

Figure 6C:
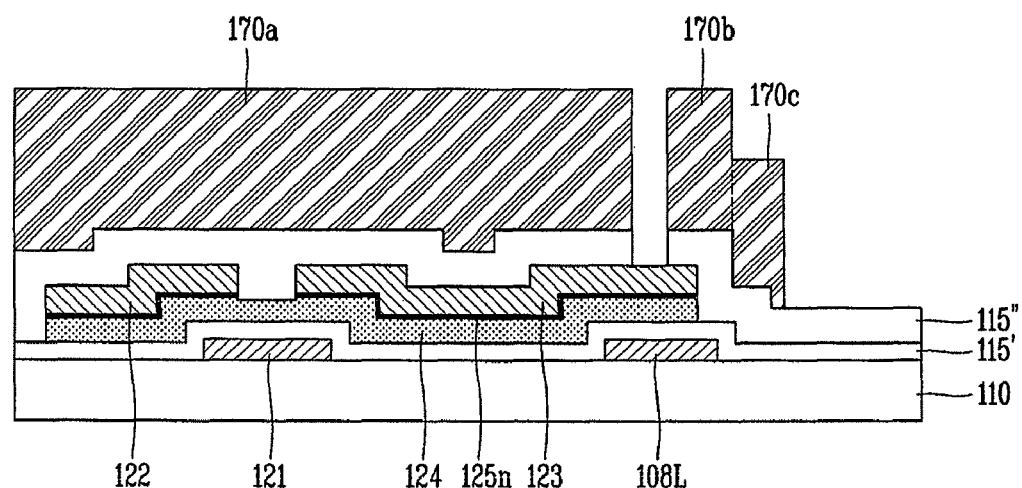

Subsequently, when the photosensitive film 170 which has been exposed through the half-tone mask 180 is developed, as shown in FIG. 6C, first to third photosensitive film patterns 170a to 170c with a certain thickness remain at regions where light has been entirely blocked or partially blocked through the blocking region (III) and the second transmission region (II), and the photosensitive film at the transmission region (I) through which light had been entirely transmitted has been completely removed to expose the surface of the second insulating layer 115''.

At this time, the first and second photosensitive film patterns 170a and 170b formed at the blocking region III are thicker than the third photosensitive film pattern 170c formed through the second transmission region II. In addition, the photosensitive film at the region where the light had entirely transmitted through the first transmission region I has been completely removed. This is because positive photoresist has been used, but the present invention is not limited thereto and negative photoresist can be also used in the present invention.

Figure 6D:
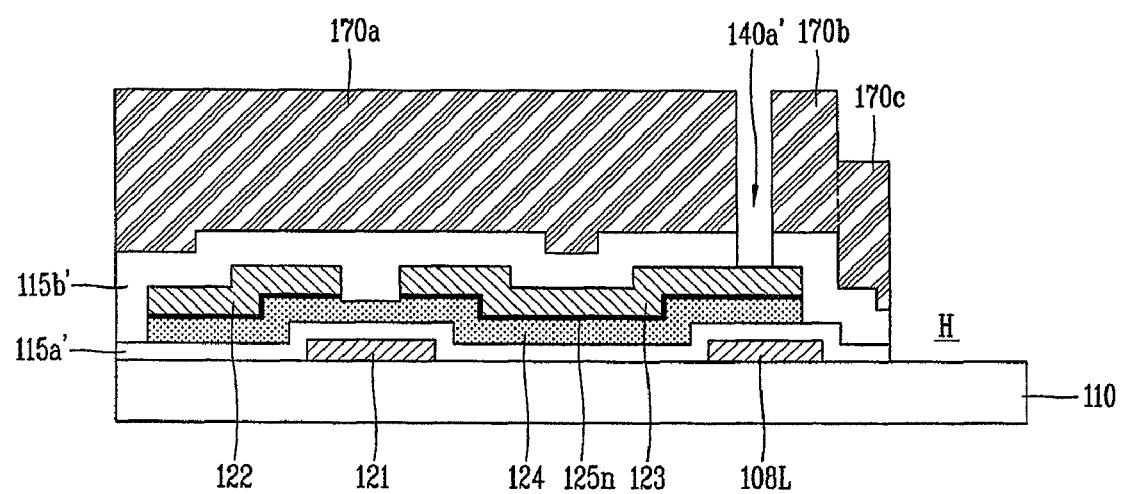

And then, as shown in FIG. 6D, a portion of the second insulating layer 115'' is selectively removed by a $1^{st}$ dry etching process using the first to third photosensitive film patterns 170a to 170c as masks to form the first contact hole 140a' exposing a portion of the drain electrode 123 at the pixel part of the array substrate 110.

Although not shown, portions of the first and second insulating layers 115a' and 115b' of the RGB color pixels are selectively removed through the $1^{st}$ dry etching process to form the second contact hole 140b exposing a portion of the common line of the RGB color pixels.

Also, through the $1^{st}$ dry etching process, the first and second insulating layers 115a' and 115b' of the pixel area of the ECB control pixel are removed to form the hole (H) opening the pixel area of the ECB control pixel.

In this case, in the pixel area of the ECB control pixel, the first insulating layer 115a' and the second insluting layer 115b' may be formed with a thickness of about 4000 Å and 1500 Å, respectively to obtain the effect of increasing the cell gap of about 5500 Å.

For reference, when the cell gap of the ECB control pixel is increased from 4.2 μm to 4.7 μm, the transmittance of the ECB control pixel can be increased by about 18 percent, improving the viewing angle control effect.

Although it may be different depending on process conditions, the hole (H) may be formed at a space of about 3 μm to 5 μm from the lower gate wiring in order to prevent a short circuit with the lower gate wiring, namely, the gate line 116 including the gate electrode 121, the connection line 108a, and the common line 108L.

Figure 6E:
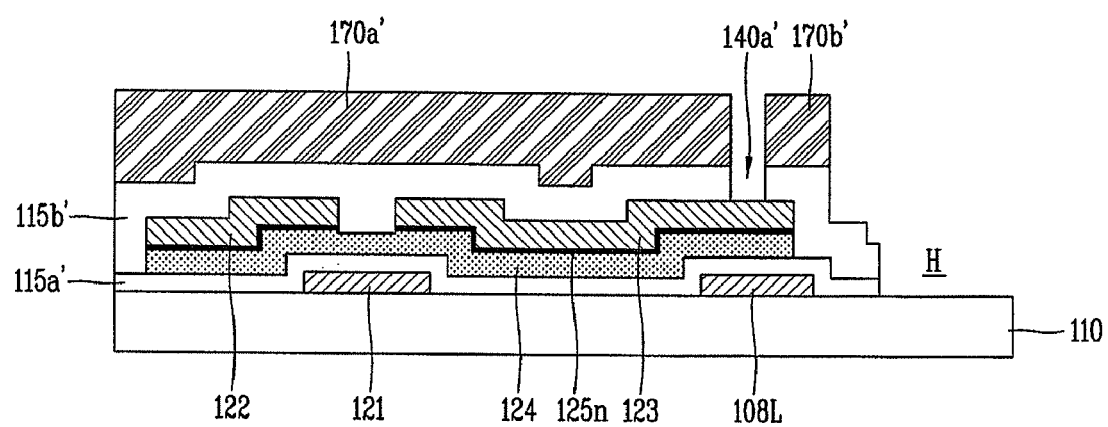

Thereafter, an ashing process is performed to partially remove the first to third photosensitive film patterns 170a to 170c. Then, as shown in FIG. 6E, the third photosensitive film pattern at the second transmission region II is completely removed.

Then, the first and second photosensitive film patterns remain as fourth and fifth photosensitive film patterns 170a' and 170b' by removing the thickness of the third photosensitive film pattern only the region corresponding to the blocking region III. In this case, the first transmission region I and the second transmission region II where the fourth photosensitive film pattern 170a' and the fifth photosensitive film pattern 170b do not remain substantially refer to the area where the first contact hole 140', the second contact hole, and the hoe (H) are formed and the ambient area of the pixel area of the ECB control pixel.

Figure 6F:
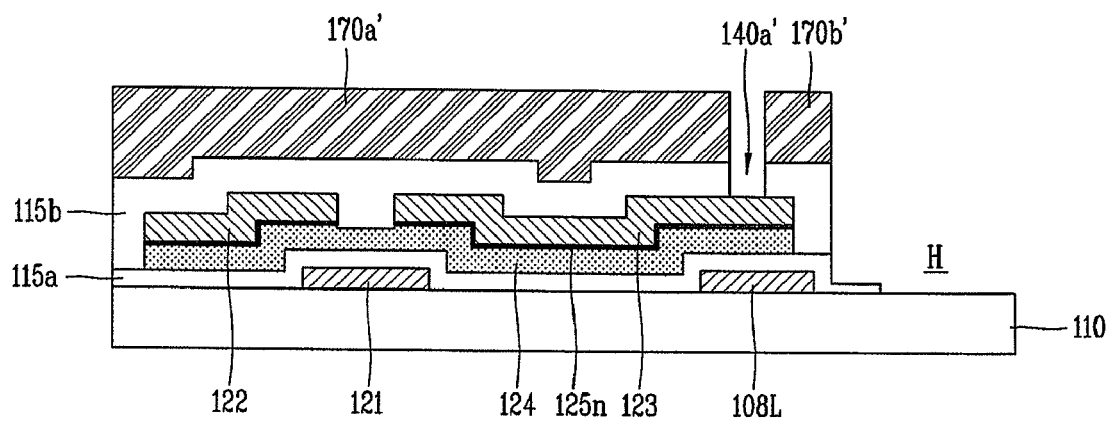

Thereafter, as shown in FIG. 6F, the entirety of the second insulating layer and a portion of the thickness of the first insulating layer of the ECB control pixel are removed by a $2^{nd}$ dry etching process using the fourth photosensitive film pattern 170a' and the fifth photosensitive film pattern 170b' as masks.

Then, the first and second insulating layers eventually become the gate insulating layer 115a and the passivation layer 115b as their portions have been removed, and the vicinity of the pixel are of the ECB control pixel is patterned to leave a portion of the thickness of the gate insulating layer 115a, thus reducing a step coverage between the gate insulating layer 115a and the array substrate 110 in the vicinity of the pixel area of the ECB control pixel according to the increase in the cell gap. As a result, a light leakage in the vicinity of the pixel area of the ECB control pixel can be prevented.

Accordingly, unlike the RGB color pixels, the ECB control pixel according to the exemplary embodiment of the present invention has the multi-cell gap.

Figure 4D:
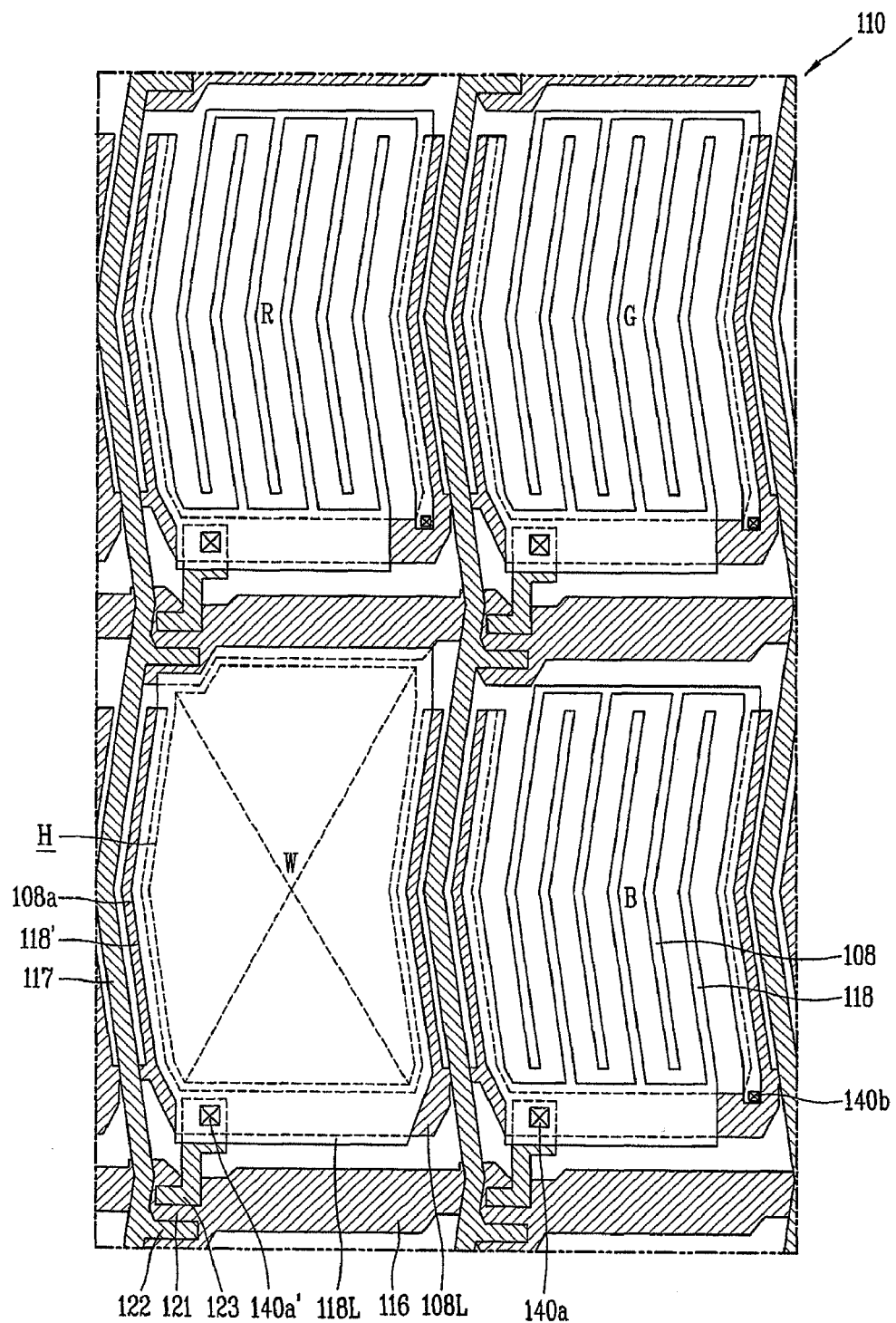
Figure 5D:
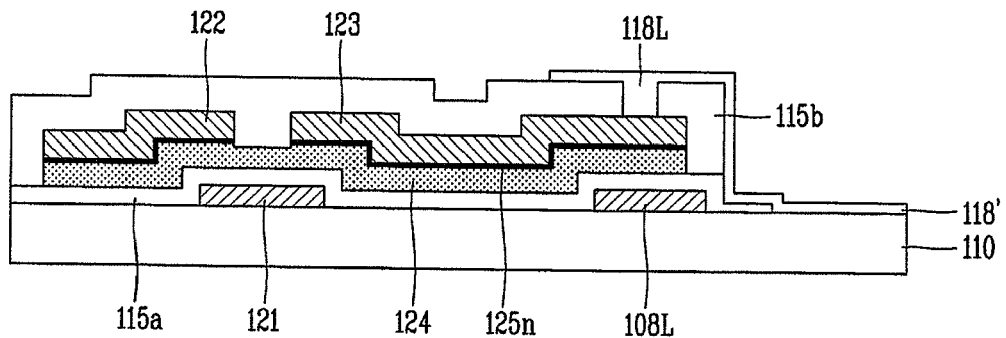

Thereafter, as shown in FIGS. 4D and 5D, the a third conductive film is formed on the passivation layer 115b where the first contact holes 140a and 140a', the second contact hole 140b, and the hole (H) are formed, and then selectively patterned through a photolithography process (a fourth masking process) to form the common electrodes 108 and the pixel electrodes 118 which are alternately disposed at the pixel area of the RGB color pixels to generate an in-plane field, and also to form the pixel electrodes 118' generating a vertical field along with the upper ITO electrode at the pixel area of the ECB control pixel.

In addition, through the fourth masking process, the pixel electrode line 118L formed of the third conductive film is formed to be substantially parallel to the gate line 116.

In this case, the third conductive film contains a transparent conductive material having good transmittance such as an ITO (Indium Tin Oxide) or IZO (Indium Zinc Oxide) to form the common electrode 108, the pixel electrodes 118 and 118', and the pixel electrode line 118L.

Here, the pixel electrode line 118L is connected with the drain electrode 123 via the first contact holes 140a and 140a', and the connection line 108a of the RGB color pixels is connected with the common electrode 108 via the second contact hole 140b.

The pixel electrode 118' of the ECB control pixel is formed within the hole (H) opening the pixel area of the ECB control pixel.

The array substrates according to the first to third embodiments of the present invention are attached with color filter substrates in a facing manner by means of a sealant applied to outer edges of the image display part. In this case, the color filter substrates include black matrixes for preventing leakage of light to the TFTs, the gate lines and the data lines, and color filters for implementing red, green and blue colors.

The attachment of the color filter substrates and the array substrates are made through attachment keys formed on the color filter substrates or the array substrates.

The present invention can be also applied to a different display device fabricated by using TFTs, for example, an OLED (Organic Light Emitting Diode) display device in which OLEDs are connected with driving transistors, as well as to the LCD device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. A method for fabricating a liquid crystal display (LCD) device, the method comprising:
providing first and second substrates including four subpixels comprising RGB color pixels and an electrically controlled birefringence (ECB) control pixel;
using a first masking process comprising:
forming a gate electrode and a gate line on the first substrate; and
forming a gate insulating layer on the gate electrode and the gate line;
using a second masking process comprising:
forming an active pattern and an ohmic-contact layer on the gate insulating layer;
forming source and drain electrodes on the active pattern and forming a data line crossing the gate line to define a pixel area;
using a third masking process comprising:
forming a passivation layer on the active pattern, the source and drain electrodes, and the data line;
removing a portion of the passivation layer through a half-tone mask to form a first contact hole exposing a portion of the drain electrode, and removing the gate insulating layer and the passivation layer of the ECB control pixel to form a hole opening the pixel area of the ECB control pixel; and
selectively removing the gate insulating layer and the passivation layer of the ECB control pixel through the half-tone mask to leave a portion of the thickness of the gate insulating layer in the vicinity of the pixel area of the ECB control pixel;
using a fourth masking process to form a pixel electrode RGB, a common electrode and a pixel electrode ECB comprising:
forming a pixel electrode within the pixel area of the RGB color pixels such that the pixel electrode is connected with the drain electrode through the first contact hole, and forming a common electrode alternately disposed with the pixel electrode to generate an in-plane field; and
forming another pixel electrode within the hole opening the pixel area of the ECB control pixel such that the another pixel electrode is connected with the drain electrode via the first contact hole; and
attaching the first and second substrate.

2. The method of claim 1, wherein the first masking process further comprises:
forming a common line in a direction parallel to the gate line, and forming a connection line in a direction parallel to the data line.

3. The method of claim 2, wherein the third masking process further comprises:
removing portions of the gate insulating layer and the passivation layer of the RGB pixels by using the half-tone mask to form a second contact hole exposing a portion of the common line.

4. The method of claim 3, wherein the common electrode of the RGB color pixels is connected with the common line via the second contact hole.

5. The method of claim 1, wherein the entirety of the passivation layer and a portion of the thickness of the gate insulating layer of the ECB control pixel are selectively removed through the half-tone mask to leave a portion of the thickness of the gate insulating layer in the vicinity of the pixel area of the ECB control pixel.

6. A liquid crystal display (LCD) device comprising:
first and second substrates including four subpixels comprising RGB color pixels and an electrically controlled birefringence (ECB) control pixel;
a gate electrode and a gate line on the first substrate;
a gate insulating layer on the gate electrode and the gate line;
an active pattern and an ohmic-contact layer on the gate insulating layer;
source and drain electrodes on the active pattern, and a data line on the active pattern and crossing the gate line to define a pixel area;
a passivation layer on the active pattern, the source and drain electrodes, and the data line, and having a first contact hole formed by removing a portion of the passivation layer and exposing a portion of the drain electrode;
a pixel electrode within the pixel area of the RGB color pixels and connected with the drain electrode through the first contact hole and a common electrode within the pixel area of the RGB color pixels and alternately disposed with the pixel electrode to generate an in-plane field; and
a pixel electrode within a hole opening the pixel area of the ECB control pixel and connected with the drain electrode via the first contact hole, and
wherein when the gate insulating layer and the passivation layer of the ECB control pixel is removed selectively, a portion of the thickness of the gate insulating layer remains in the vicinity of the pixel area of the ECB control pixel.

7. The device of claim 6, further comprising:
a common line formed in a direction parallel to the gate line by using a first conductive film constituting the gate electrode and the gate line, and a connection line formed in a direction parallel to the data line.

8. The device of claim 7, further comprising:
a second contact hole formed by removing portions of the gate insulating layer and the passivation layer of the RGB color pixels, and exposing a portion of the common line.

9. The device of claim 8, wherein the common electrode of the RGB color pixels is connected with the common line via the second contact hole.

10. The device of claim 6, wherein the entirety of the passivation layer and a portion of the thickness of the gate insulating layer of the ECB control pixel are selectively removed to leave a portion of the thickness of the gate insulating layer in the vicinity of the pixel area of the ECB control pixel.

* * * * *